(12) United States Patent
Nakagawasai et al.

(10) Patent No.: US 11,532,784 B2
(45) Date of Patent: Dec. 20, 2022

(54) SUBSTRATE PROCESSING APPARATUS AND METHOD

(71) Applicant: TOKYO ELECTRON LIMITED, Tokyo (JP)

(72) Inventors: Manabu Nakagawasai, Tokyo (JP); Koji Maeda, Nirasaki (JP); Shinji Orimoto, Nirasaki (JP); Motoi Yamagata, Fuchu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/193,545

(22) Filed: Mar. 5, 2021

(65) Prior Publication Data
US 2021/0280777 A1 Sep. 9, 2021

(30) Foreign Application Priority Data
Mar. 6, 2020 (JP) .............................. JP2020-039064

(51) Int. Cl.
*H01L 43/12* (2006.01)
*C23C 14/50* (2006.01)
*C23C 14/54* (2006.01)

(52) U.S. Cl.
CPC ............ *H01L 43/12* (2013.01); *C23C 14/505* (2013.01); *C23C 14/541* (2013.01)

(58) Field of Classification Search
None
See application file for complete search history.

(56) References Cited

U.S. PATENT DOCUMENTS

| 2010/0022423 | A1* | 1/2010 | Lu | C10M 171/06 |
| | | | | 508/113 |
| 2011/0297321 | A1* | 12/2011 | Matsuda | H01L 21/6831 |
| | | | | 118/723 R |
| 2013/0039041 | A1* | 2/2013 | Yeh | F21S 8/04 |
| | | | | 29/841 |
| 2015/0179408 | A1* | 6/2015 | Shimomura | H01J 37/32211 |
| | | | | 438/758 |
| 2018/0233396 | A1* | 8/2018 | Matsushita | H01L 21/67253 |
| 2022/0142927 | A1* | 5/2022 | Herbig | A61P 29/00 |

FOREIGN PATENT DOCUMENTS

JP 2019-016771 A 1/2019

* cited by examiner

*Primary Examiner* — Shamim Ahmed
*Assistant Examiner* — Bradford M Gates
(74) *Attorney, Agent, or Firm* — Fenwick & West LLP

(57) ABSTRACT

A substrate processing apparatus includes a processing chamber where a substrate support on which a substrate is placed and a target holder configured to hold a target are disposed, a freezing device disposed with a gap with respect to a bottom surface of the substrate support and having a chiller and a cold heat medium laminated on the chiller, and a rotating device configured to rotate the substrate support. The substrate processing apparatus further includes a first elevating device configured to raise and lower the substrate support, a coolant channel formed in the chiller to supply a coolant to the gap, and a cold heat transfer material disposed in the gap and being in contact with the substrate support and the cold heat medium so as to transfer heat therebetween.

18 Claims, 4 Drawing Sheets

SUBSTRATE PROCESSING APPARATUS AND METHOD

CROSS-REFERENCE TO RELATED APPLICATION

This application claims priority to Japanese Patent Application No. 2020-039064, filed on Mar. 6, 2020, the entire contents of which are incorporated herein by reference.

TECHNICAL FIELD

The present disclosure relates to a substrate processing apparatus and method.

BACKGROUND

Japanese Patent Application Publication No. 2019-016771 discloses a substrate support structure constituting a processing apparatus that includes a fixed cold heat transfer body, a rotatable outer cylinder disposed around the cold heat transfer body, and a substrate support connected to the outer cylinder with a gap with respect to an upper surface of the cold heat transfer body. The cold heat transfer body is fixedly on a chiller, and an upper portion of the cold heat transfer body is disposed in a vacuum container. A cooling gas supply unit for supplying a cooling gas while communicating with the gap is formed in the cold heat transfer body.

SUMMARY

The present disclosure provides a substrate processing apparatus and a substrate processing method capable of efficiently exchanging heat between a freezing device and a substrate support constituting a substrate processing apparatus.

In accordance with an aspect of the present disclosure, there is provided a substrate processing apparatus including: a processing chamber where a substrate support on which a substrate is placed and a target holder configured to hold a target are disposed; a freezing device disposed with a gap with respect to a bottom surface of the substrate support and having a chiller and a cold heat medium laminated on the chiller; a rotating device configured to rotate the substrate support; a first elevating device configured to raise and lower the substrate support; a coolant channel formed in the chiller to supply a coolant to the gap; and a cold heat transfer material disposed in the gap and being in contact with the substrate support and the cold heat medium so as to transfer heat therebetween.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
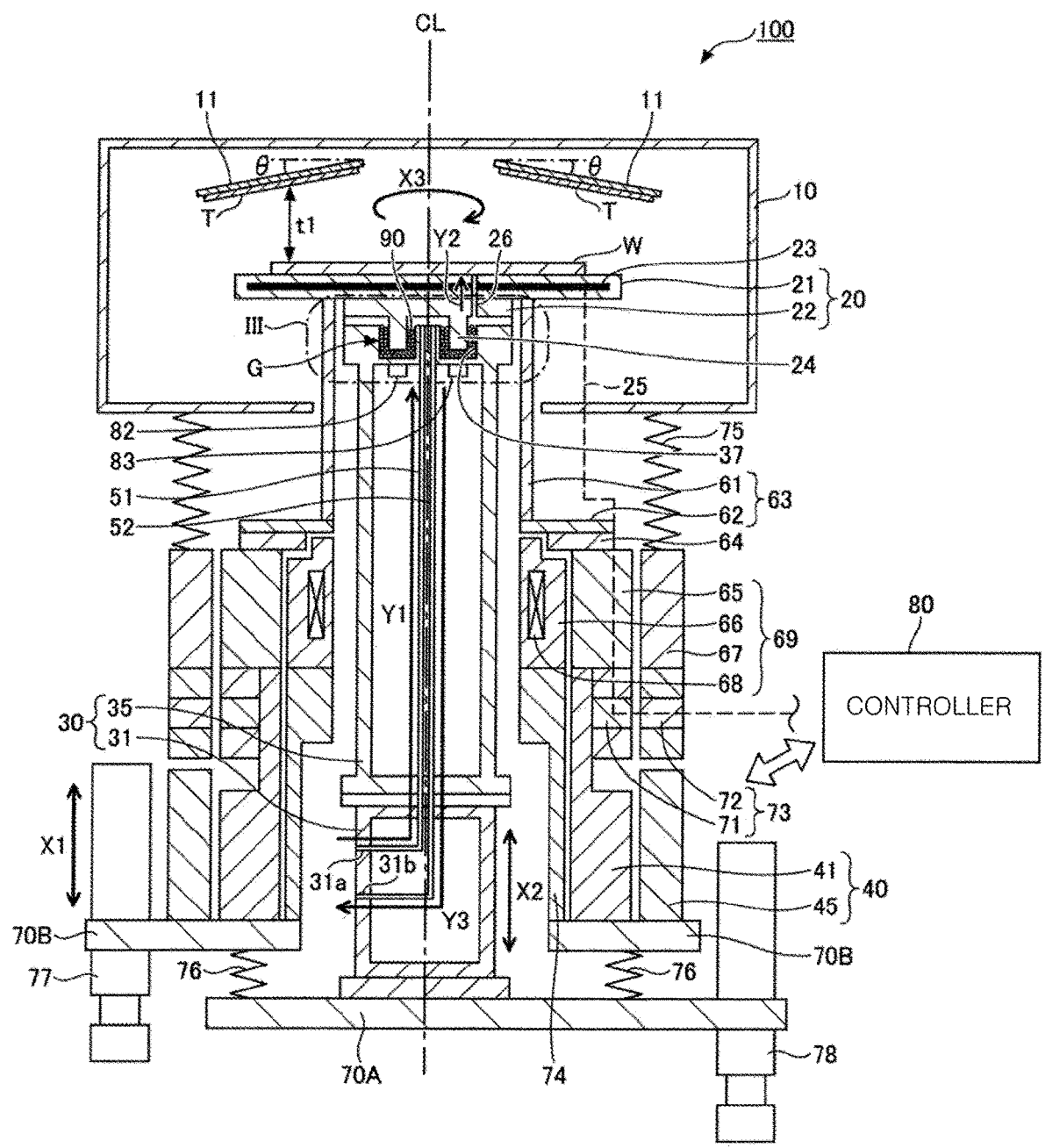
FIG. 1 is a vertical cross-sectional view showing an example of a substrate processing apparatus according to an embodiment.

Hereinafter, a substrate processing apparatus and a substrate processing method according to embodiments of the present disclosure will be described with reference to the accompanying drawings. Like reference numerals will be given to substantially like parts throughout this specification and the drawings, and redundant description thereof may be omitted.

(Substrate Processing Apparatus and Substrate Processing Method According to Embodiments)

Figure 2:
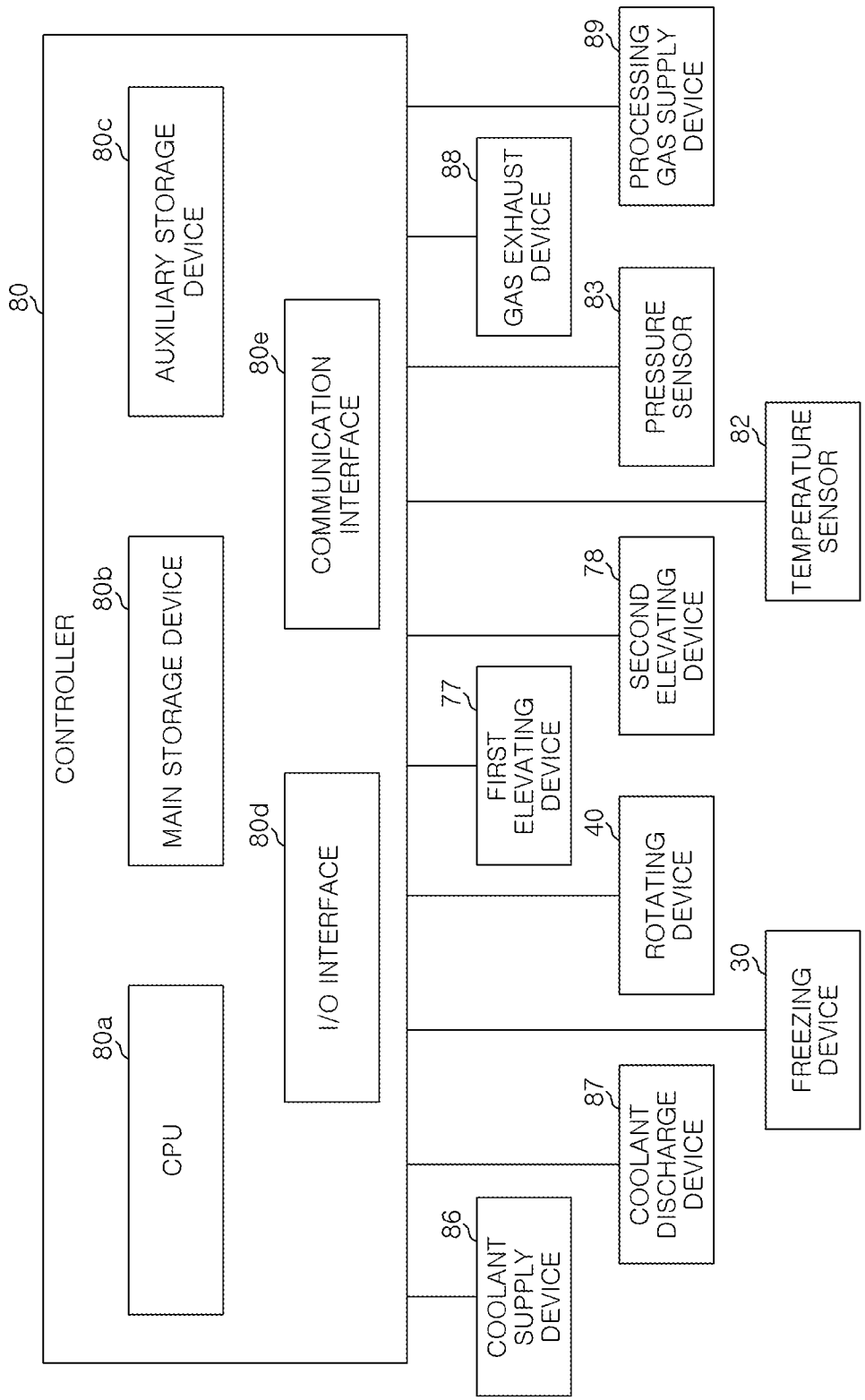
FIG. 2 shows an example of a hardware configuration of a controller constituting a substrate processing apparatus together with peripheral devices.
Figure 3:
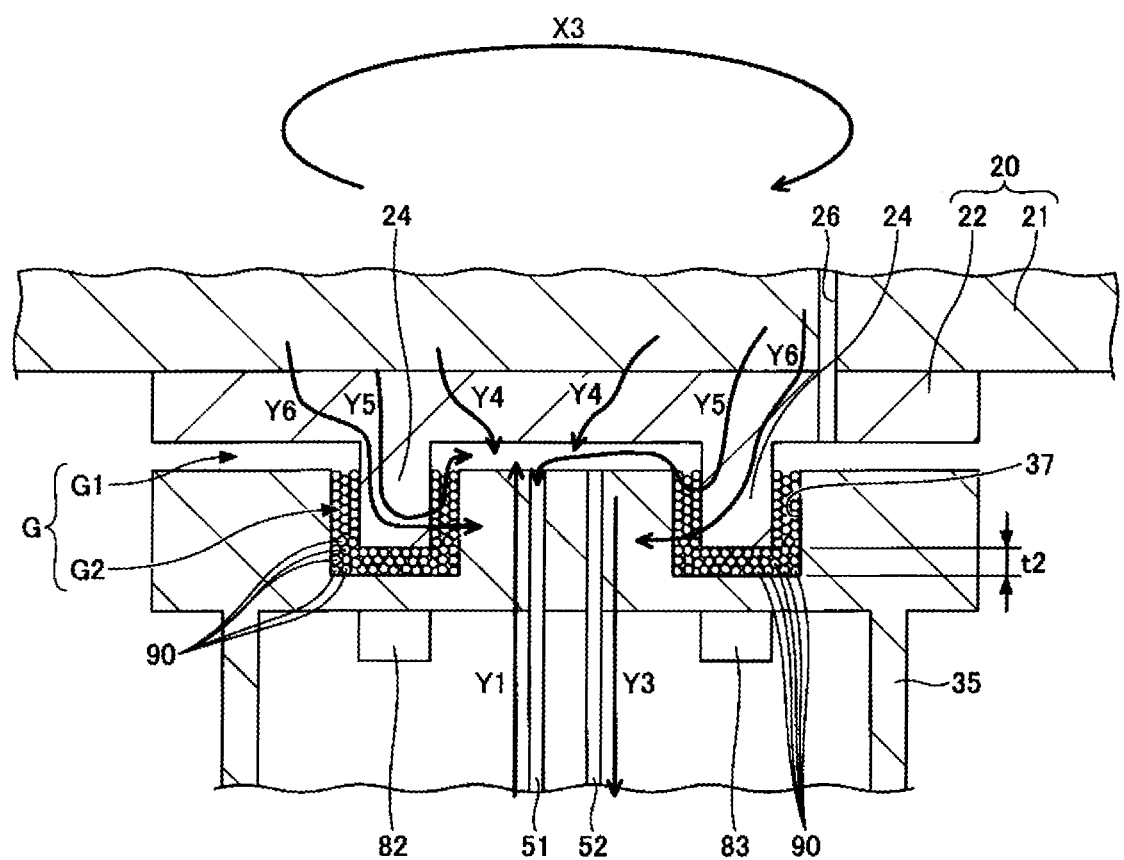
FIG. 3 is an enlarged view of an area III of FIG. 1, showing a state in which an example of a cold heat transfer material is disposed in a gap between a bottom surface of a substrate support and an upper surface of a cold heat medium.
Figure 4:
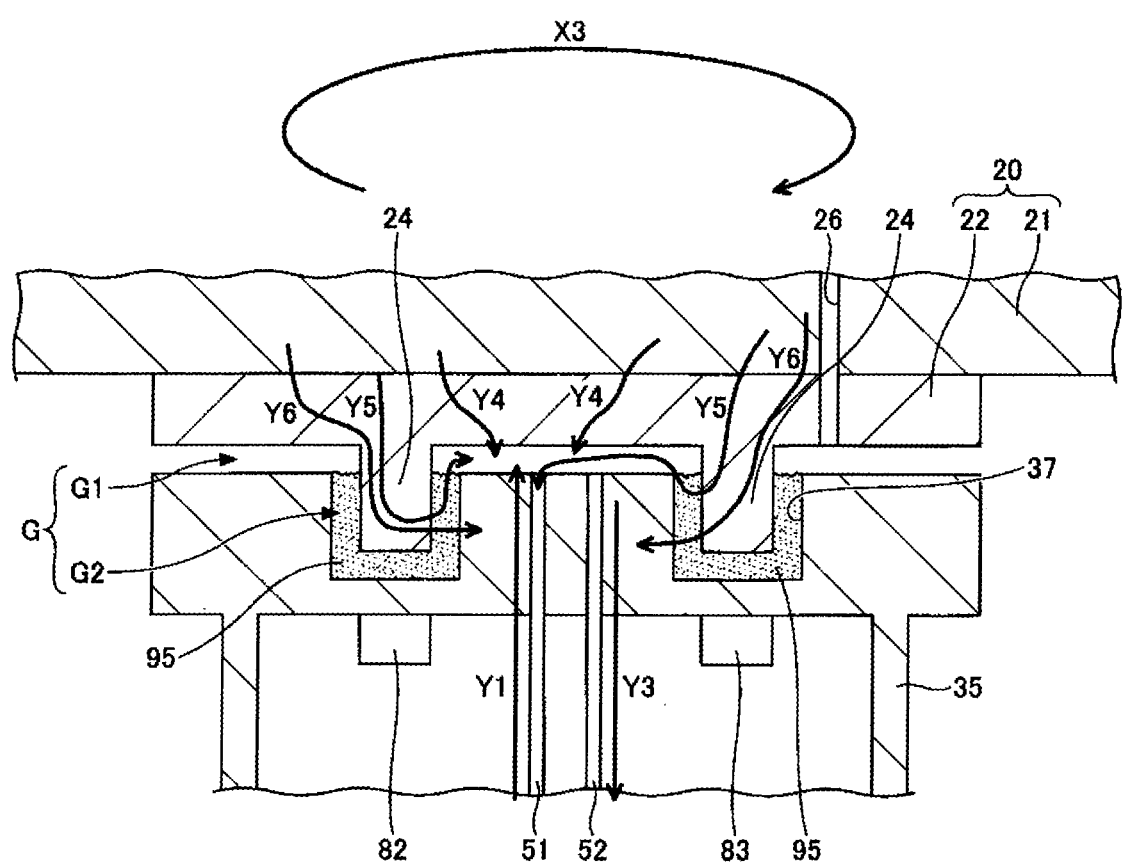
FIG. 4 is an enlarged view of the area III of FIG. 1, showing a state in which another example of the cold heat transfer material is disposed in the gap between the bottom surface of the substrate support and the upper surface of the cold heat medium.

Examples of a substrate processing apparatus and a substrate processing method according to embodiments of the present disclosure will be described with reference to FIGS. 1 to 4. FIG. 1 is a vertical sectional view showing an example of the substrate processing apparatus according to the embodiment. FIG. 2 shows an example of a hardware configuration of a controller constituting the substrate processing apparatus together with peripheral devices. FIGS. 3 and 4 are enlarged views of an area III of FIG. 1, showing a state in which examples of a cold heat transfer material are disposed in a gap between a bottom surface of a substrate support and an upper surface of a cold heat medium.

A substrate processing apparatus 100 shown in FIG. 1 is, e.g., a physical vapor deposition (PVD) forming a magnetic film or the like on a substrate W such as a semiconductor wafer as a target object in a processing chamber 10 where an environment of ultra-high vacuum and an extremely low temperature is generated and substrate processing is performed using a processing gas. In this specification, the ultra-high vacuum indicates a pressure atmosphere of, e.g., $10^{-5}$ Pa or less, and the extremely low temperature indicates a temperature atmosphere of $-30°$ C. or lower, e.g., about $-200°$ C. The magnetic film formed on the substrate W is used for, e.g., a tunneling magneto-resistance (TMR) element.

The substrate processing apparatus 100 includes a processing chamber 10, a substrate support 20 on which a substrate W is placed in the processing chamber 10, a freezing device 30, a rotating device 40 for rotating the substrate support 20, a first elevating device 77 for raising and lowering the substrate support 20, and a second elevating device 78 for raising and lowering the freezing device 30. The substrate processing apparatus 100 further includes a controller 80 for controlling various devices such as the freezing device 30, the first elevating device 77, and the like. The substrate processing apparatus 100 of the illustrated example includes two elevating devices, i.e., the first elevating device 77 for raising and lowering the substrate support 20, and the second elevating device 78 for raising and lowering the freezing device 30. However, the substrate support 20 and the freezing device 30 may be raised and lowered by a common elevating device.

The substrate support 20 is disposed at an inner lower space of the processing chamber 10, and a plurality of target holders 11 is disposed above the substrate support 20 while being fixed with a predetermined inclination angle θ with respect to the horizontal plane. Further, different types of target T are attached to bottom surfaces of the target holders 11.

The processing chamber 10 is configured such that a pressure therein can be reduced to an ultra-high vacuum level by operating a gas exhaust device (not shown) such as a vacuum pump or the like. Further, a processing gas (e.g., nitrogen ($N_2$) gas or a rare gas such as argon (Ar), krypton (Kr), neon (Ne), or the like) required for sputtering film formation is supplied to the processing chamber 10 through a gas supply line communicating with a processing gas supply device (both not shown).

An AC voltage or a DC voltage is applied from a plasma generation power supply (not shown) to the target holder 11. When an AC voltage is applied from the plasma generation power supply to the target holder 11 and the target T, plasma is generated in the processing chamber 10, and the rare gas or the like in the processing chamber 10 is ionized. The target T is sputtered by the ionized rare gas elements or the like. Atoms or molecules of the sputtered target T are deposited on the surface of the substrate W held on the substrate support 20 while facing the target T.

Since the target T is inclined with respect to the substrate W, incident angles of the particles sputtered from the target T on the substrate W can be adjusted, and in-plane uniformity of a thickness of a film such as a magnetic film formed on the substrate W or the like can be improved. Even when the target holders 11 have the same inclination angle θ in the processing chamber 10, the incident angles of the sputtered particles with respect to the substrate W can be changed by adjusting a distance t1 between the target T and the substrate W by raising and lowering the substrate support 20. Accordingly, the substrate support 20 can be raised and lowered such that the distance t1 suitable for each target T can be obtained.

Although the number of targets T is not particularly limited, it is preferable to provide a plurality of different targets T in the processing chamber 10 to sequentially form different films made of different materials in one substrate processing apparatus 100. For example, in the case of depositing a magnetic film (film containing a ferromagnetic material such as Ni, Fe, Co, or the like), it is possible to use, e.g., CoFe, FeNi, and NiFeCo as a material of the target T. Further, a material in which another element is mixed with such materials may be used as the material of the target T.

The substrate support 20 is disposed above the freezing device 30 formed by laminating a chiller 31 and a cold heat medium 35. More specifically, the substrate support 20 is disposed with a gap G with respect to an upper surface of the cold heat medium 35. The cold heat medium 35 may be referred to as "cold link."

The chiller 31 holds the cold heat medium 35 and cools the upper surface of the cold heat medium 35 to an extremely low temperature. The chiller 31 preferably uses a Gifford-McMahon (GM) cycle in view of cooling performance.

The cold heat medium 35 is fixed on the chiller 31, and an upper portion of the cold heat medium 35 is accommodated in the processing chamber 10. The cold heat medium 35 is made of copper (Cu) or the like having high thermal conductivity, and has a substantially cylindrical outer shape. The cold heat medium 35 is disposed such that the center thereof coincides with a central axis CL of the substrate support 20.

A coolant supply channel 51 (example of a coolant channel) for supplying a coolant (cooling gas) to the gap G between the cold heat medium 35 and the substrate support 20 and a coolant discharge channel 52 (example of a coolant channel) for discharging a coolant whose temperature is increased by heat transfer from the substrate support 20 are disposed in the cold heat medium 35 and the chiller 31. Further, the coolant supply channel 51 and the coolant discharge channel 52 are fixed to connection fixing portions 31a and 31b on a wall surface of the chiller 31, respectively. A line communicating with a coolant supply device and a line communicating with a coolant discharge device (all not shown) are connected to the connection fixing portions 31a and 31b, respectively.

The coolant supplied from the coolant supply device flows through the coolant supply channel 51 in a Y1 direction and is supplied to the gap G. On the other hand, the coolant discharged from the gap G flows through the coolant discharge channel 52 in a Y3 direction and is discharged to the coolant discharge device. The coolant supply channel and the coolant discharge channel may be the same channel. As the coolant supplied to the gap G to cool the substrate support 20, helium (He) gas having high thermal conductivity is preferably used. By supplying the coolant to the gap G through the coolant supply channel 51, the substrate support 20 can be cooled to an extremely low temperature. Thermal grease having good thermal conductivity may be used as the coolant, instead of the cooling gas.

The substrate support 20 has a structure in which an upper first plate 21 on which the substrate W is placed and a lower second plate 22 are laminated. Both plates are made of copper (Cu) having high thermal conductivity. The first plate 21 includes an electrostatic chuck having a chuck electrode 23 embedded in a dielectric film. A predetermined potential is applied to the chuck electrode 23 through a wiring 25. With this configuration, the substrate W can be attracted to the electrostatic chuck and the substrate W can be fixed to the upper surface of the substrate support 20. The substrate support 20 does not necessarily have the laminated structure of the first plate 21 and the second plate 22. Instead, the substrate support 20 may be a single plate, or may be integrally molded by sintering or the like.

The substrate support 20 has a through-hole 26 vertically penetrating through the first plate 21 and the second plate 22. The through-hole 26 communicates with the gap G disposed below the substrate support 20, and the coolant supplied to the gap G is supplied in a Y2 direction to the gap between the upper surface of the substrate support 20 (electrostatic chuck) and a backside of the substrate W through the through-hole 26. Accordingly, it is possible to efficiently transfer the cold heat of the coolant and the cold heat medium 35 to the substrate W. In the illustrated example, the coolant flowing through the coolant supply channel 51 is supplied to the backside of the substrate W through the through-hole 26, and the coolant discharged through the through-hole 26 flows through the coolant discharge channel 52 and is discharged. However, the coolant may be supplied and discharged in a different manner. For example, the through-hole 26 may be provided with an independent coolant channel different from the coolant supply channel 51 and the coolant discharge channel 52, and the coolant from the through-hole 26 can be supplied or discharged through the independent coolant channel.

A protrusion 24 protruding toward the cold heat medium 35 is formed on a bottom surface of the second plate 22 constituting the substrate support 20. The protrusion 24 in the illustrated example is an annular protrusion surrounding the central axis CL of the substrate support 20. The height of the protrusion 24 may be set to, e.g., 40 mm to 50 mm, and the width of the protrusion 24 may be set to, e.g., 6 mm to 7 mm. The shape of the protrusion 24 is not particularly limited, it is preferable that the protrusion 24 has a large surface area in order to increase heat exchange efficiency with the cold heat medium 35. For example, the protrusion 24 may have a corrugated outer surface, or may have an uneven outer surface by blasting or the like. In both cases, the surface area of the protrusion 24 can be increased, and the heat exchange efficiency with the cold heat medium 35 can be improved.

A recess 37 into which the protrusion 24 is loosely fitted is formed on the upper surface of the cold heat medium 35, i.e., the surface of the substrate support 20 facing the protrusion 24. The recess 37 in the illustrated example has an annular shape surrounding the central axis CL of the substrate support 20. The height of the recess 37 may be the same as the height of the protrusion 24, and may be, e.g., 40 mm to 50 mm. Further, the width of the recess 37 may be slightly greater than the width of the protrusion 24, and is preferably, e.g., 7 mm to 9 mm. The shape of the recess 37 is preferably set to correspond to the shape of the protrusion 24. For example, when the outer surface of the protrusion 24 has a corrugated shape, it is preferable that the inner surface of the recess 37 has a corrugated shape corresponding thereto. Further, it is preferable that the recess 37 has an uneven inner surface by blasting or the like. Due to the uneven processing, the surface area of the recess 37 can be increased and the heat exchange efficiency with the substrate support 20 can be improved.

In a state where the protrusion 24 is loosely fitted in the recess 37, the gap G is formed between the recess 37 and the protrusion 24. As shown in FIG. 3, the gap G has an upper gap G1 between a flat bottom surface of the second plate 22 of the substrate support 20 and a flat upper surface of the cold heat medium 35 and a lower gap G2 between the recess 37 and the protrusion 24. A cold heat transfer material 90 is disposed in the lower gap G2. The cold heat transfer material 90 or the effect of the cold heat transfer material 90 disposed in a part of the gap G will be described in detail below.

Referring back to FIG. 1, the substrate support 20 is supported by an outer cylinder 63. The outer cylinder 63 is disposed to cover an outer peripheral surface of the upper portion of the cold heat medium 35. An upper portion of the outer cylinder 63 enters the processing chamber 10 and supports the substrate support 20 in the processing chamber 10. The outer cylinder 63 has a cylindrical portion 61 whose inner diameter is slightly greater than an outer diameter of the cold heat medium 35, and a flange portion 62 extending outward on a bottom surface of the cylindrical portion 61. The cylindrical portion 61 directly supports the substrate support 20. The cylindrical portion 61 and the flange portion 62 are made of a metal such as stainless steel or the like.

A heat insulating member 64 is connected to a bottom surface of the flange portion 62. The heat insulating member 64 has a substantially cylindrical shape extending coaxially with the flange portion 62, and is fixed to the bottom surface of the flange portion 62. The heat insulating member 64 is made of ceramics such as alumina or the like. A magnetic fluid seal unit 69 is disposed on a bottom surface of the heat insulating member 64.

The magnetic fluid seal unit 69 includes a rotating portion 65, an inner fixing portion 66, an outer fixing portion 67, and a heating portion 68. The rotating portion 65 has a substantially cylindrical shape extending coaxially with the heat insulating member 64, and is fixed to the bottom surface of the heat insulating member 64. In other words, the rotating portion 65 is connected to the outer cylinder 63 via the heat insulating member 64. With this configuration, the heat transfer of the cold heat of the outer cylinder 63 to the rotating portion 65 is blocked by the heat insulating member 64, which makes it possible to suppress the deterioration of the sealing performance or the occurrence of condensation due to the decrease in the temperature of the magnetic fluid of the magnetic fluid seal unit 69.

The inner fixing portion 66 is disposed between the cold heat medium 35 and the rotating portion 65 via a magnetic fluid. The inner fixing portion 66 is formed in a substantially cylindrical shape having an inner diameter greater than an outer diameter of the cold heat medium 35 and having an outer diameter smaller than an inner diameter of the rotating portion 65. The outer fixing portion 67 is disposed outside the rotating portion 65 via a magnetic fluid. The outer fixing portion 67 is formed in a substantially cylindrical shape having an inner diameter greater than an outer diameter of the rotating portion 65. The heating portion 68 is embedded in the inner fixing portion 66 and heats the entire magnetic fluid seal unit 69. With this configuration, it is possible to suppress the deterioration of the sealing performance or the occurrence of condensation due to the decrease in the temperature of the magnetic fluid of the magnetic fluid seal unit 69. With these configurations, in the magnetic fluid seal unit 69, the rotating portion 65 is rotatable with respect to the inner fixing portion 66 and the outer fixing portion 67 in an airtight state. In other words, the outer cylinder 63 is rotatably supported via the magnetic fluid seal unit 69.

A substantially cylindrical bellows 75 is disposed between an upper surface of the outer fixing portion 67 and a bottom surface of the processing chamber 10. The bellows 75 has a metal bellows structure that can be expanded and contracted in a vertical direction. The bellows 75 surrounds an upper portion of the cold heat medium 35, a lower portion of the outer cylinder 63, and the heat insulating member 64, and separates a depressurizable inner space of the processing chamber 10 and an outer space of the processing chamber 10.

A slip ring 73 is disposed below the magnetic fluid seal unit 69. The slip ring 73 has a rotating body 71 including a metal ring and a fixed body 72 including a brush. The rotating body 71 has a substantially cylindrical shape extending coaxially with the rotating portion 65 of the magnetic fluid seal unit 69, and is fixed to the bottom surface of the rotating portion 65. The fixed body 72 is formed in a substantially cylindrical shape having an inner diameter slightly larger than an outer diameter of the rotating body 71. The slip ring 73 is electrically connected to a DC power supply (not shown), and supplies a power supplied from the DC power supply to the wiring 25 via the brush of the fixed body 72 and the metal ring of the rotating body 71. With this configuration, it is possible to apply a potential to the chuck electrode from the DC power supply without twisting or the like of the wiring 25. The rotating body 71 constituting the slip ring 73 is attached to the rotating device 40. The slip ring may have a structure other than a brush structure, e.g., a non-contact power supply structure, a structure having a mercury-free liquid or a conductive liquid, or the like.

The rotating device 40 is a direct drive motor having a rotor 41 and a stator 45. The rotor 41 has a substantially cylindrical shape extending coaxially with the rotating body 71 of the slip ring 73, and is fixed to the rotating body 71. The stator 45 is formed in a substantially cylindrical shape having an inner diameter is greater than an outer diameter of the rotor 41. With this configuration, when the rotor 41 rotates, the rotating body 71, the rotating portion 65, the outer cylinder 63, and the substrate support 20 rotate in a X3 direction with respect to the cold heat medium 35. The rotating device is not necessarily the direct drive motor, and may include a servomotor and a transmission belt.

A heat insulating body 74 having a vacuum insulated double-walled structure is disposed around the chiller 31 and the cold heat medium 35. In the illustrated example, the heat insulating body 74 is disposed between the chiller 31 and the rotor 41 and between a portion below the cold heat medium 35 and the rotor 41. With this configuration, the transfer of the cold heat of the chiller 31 and the cold heat medium 35 to the rotor 41 can be suppressed.

The chiller 31 is fixed to an upper surface of a first support 70A that is vertically movably attached to the second elevating device 78. On the other hand, the rotating device 40 and the heat insulating body 74 are fixed to an upper surface of a second support 70B that is vertically movably attached to the first elevating device 77. A substantially cylindrical bellows 76 surrounding the chiller 31 is disposed between the upper surface of the first support 70A and a bottom surface of the second support 70B. Similarly to the bellows 75, the bellows 76 has a metal bellows structure that can be expanded and contracted in the vertical direction.

A second cooling gas supply unit (not shown) for supplying a cooling gas (e.g., a second cooling gas) different from the cooling gas (e.g., a first cooling gas) flowing through the coolant supply channel 51 may be disposed around the chiller 31 and the cold heat medium 35. The second cooling gas supply unit supplies the second cooling gas to the space between the cold heat medium 35 and the outer cylinder 63. The second cooling gas has thermal conductivity different from that of the first cooling gas flowing through the coolant supply channel 51, and preferably has relatively low thermal conductivity. Therefore, the second cooling gas has a relatively high temperature compared to that of the first cooling gas flowing through the coolant supply channel 51. Accordingly, it is possible to prevent the first cooling gas leaking from the gap G into a side space from entering the magnetic fluid seal unit 69. In other words, the second cooling gas functions as a counterflow to the first cooling gas leaking from the gap G. With this configuration, it is possible to suppress the deterioration of the sealing performance or the occurrence of condensation due to the decrease in the temperature of the magnetic fluid of the magnetic fluid seal unit 69. Further, it is preferable that a supply pressure of the second cooling gas supplied from the second cooling gas supply unit is substantially the same as or slightly higher than a supply pressure of the first cooling gas flowing through the coolant supply channel 51 in order to enhance the function as the counterflow. As the second cooling gas, a low boiling point gas such as argon gas, neon, or the like may be used.

A temperature sensor 82 for detecting a temperature of the gap G or the like and a pressure sensor 83 for detecting a pressure of the gap G or the like are disposed above the cold heat medium 35. As the temperature sensor 82, it is possible to use, e.g., a silicon diode temperature sensor or a low temperature sensor such as a platinum resistance temperature sensor or the like. The data measured by the temperature sensor 82 and the pressure sensor 83 are transmitted to the controller 80 at any time.

Among the components of the substrate processing apparatus 100, the freezing device 30 is configured to be raised and lowered in the X2 direction by the second elevating device 78, and the components other than the freezing device 30 and the processing chamber 10 are configured to be raised and lowered in the X1 direction by the first elevating device 77.

The changes in the gap G between the substrate support 20 and the cold heat medium 35 can be avoided by raising and lowering the freezing device 30 using the second elevating device 78. Specifically, the cold heat medium 35 is contracted by about several mm due to its cold heat, so that the height (or width) of the gap G may be changed. When the cold heat medium 35 is thermally contracted with respect to the substrate support 20 fixed at a predetermined height and the gap G is changed in a film forming process, the vertical movement of the freezing device 30 is precisely controlled by the second elevating device 78. With this control, it is possible to avoid the changes in the gap G and to continue the film forming process while maintaining the initial gap G.

The distance t1 between the target T and the substrate W can be adjusted by raising and lowering the substrate support 20 in the processing chamber 10 using the first elevating device 77. The distance t1 is appropriately adjusted depending on the type of the target T. When the substrate support 20 is raised and lowered to adjust the distance t1, the controller 80 performs synchronous control of the first elevating device 77 and the second elevating device 78. Since the controller 80 performs the synchronous control of the first elevating device 77 and the second elevating device 78, it is possible to control the vertical movement of both the substrate support 20 and the freezing device 30 while maintaining the initial gap G.

The controller 80 is a computer. As shown in FIG. 2, the controller 80 includes a central processing unit (CPU) 80a, a main storage device 80b, an auxiliary storage device 80c, an input/output interface 80d, and a communication interface 80e that are connected to each other by a connection bus. The main storage device 80b and the auxiliary storage device 80c are computer-readable recording media. The above components may be provided individually, or some components may not be provided.

The CPU 80a is also referred to as a microprocessor (MPU) or a processor, and may be a single processor or a multiprocessor. The CPU 80a is a central processing unit for controlling the entire controller 80. The CPU 80a enables an execution of e.g., a program stored in the auxiliary storage device 80c in a work area of the main storage device 80b. Further, the CPU 80a controls peripheral devices by executing the program, so that an intended function is realized. The main storage device 80b stores a computer program executed by the CPU 80a, data processed by the CPU 80a, or the like. The main storage device 80b includes, e.g., a flash memory, a random access memory (RAM), or a read only memory (ROM). The auxiliary storage device 80c may be a readable/writable storage medium that stores various programs and various data therein. The auxiliary storage device 80c is also referred to as "external storage device." The auxiliary storage device 80c stores, e.g., an operating system (OS), various programs, various tables, and the like. The OS includes, e.g., a communication interface program for transferring and receiving data to and from an external device connected through the communication interface 80e. The auxiliary storage device 80c is used as, e.g., an auxiliary storage area of the main storage device 80b, and stores computer programs executed by the CPU 80a, data processed by the CPU 80a, and the like. The auxiliary storage device 80c is a silicon disk including a non-volatile semiconductor memory (flash memory, erasable programmable ROM (EPROM)), a hard disk drive (HDD) device, a solid state drive device, or the like. Further, the auxiliary storage device 80c may be a removable recording medium drive device such as a CD drive device, a DVD drive device, a BD drive device, or the like. The removable recording medium may be a CD, a DVD, a BD, a universal serial bus (USB), a memory, a secure digital (SD) memory card, or the like. The communication interface 80e is an interface for a network connected to the controller 80. The input/output interface 80d is an interface for inputting/outputting data to/from a device connected to the controller 80. The input/output interface 80d is connected to, e.g., a keyboard, a pointing device such as a touch panel or a mouse, an input device such as a microphone, or the like. The controller 80 receives an operation instruction or the like from an operator of the input device through the input/output interface 80d. Further, the input/output interface 80d is connected to, e.g., a display device such as a liquid crystal panel (LCD), an organic electroluminescence (EL) panel, and an output device such as a printer, a speaker, or the like. The controller 80 outputs data or information processed by the CPU 80a and data or information stored in the main storage device 80b and the auxiliary storage device 80c through the input/output interface 80d. The temperature sensor 82 and the pressure sensor 83 may be connected to the input/output interface 80d in a wired manner, or may be connected to the communication interface 80e through a network.

The controller 80 controls the operation of various peripheral devices. The peripheral devices include a coolant supply device 86, a coolant discharge device 87, the freezing device 30, the rotating device 40, the first elevating device 77, the second elevating device 78, the temperature sensor 82, the pressure sensor 83, a gas exhaust device 88, a processing gas supply device 89, and the like. The CPU 80a executes a predetermined process based on a recipe stored in a storage area such as a ROM or the like. Control information of the substrate processing apparatus 100 for processing conditions is set in the recipe. The control information includes, e.g., a gas flow rate, a pressure in the processing chamber 10, a temperature in the processing chamber 10, a temperature of the substrate support 20, a temperature of the coolant supplied to the gap G, a height and a width of the gap G, various processing times, and the like.

The controller 80 controls the coolant supply device 86, the coolant discharge device 87, and the freezing device 30 such that that an initial temperature and an initial pressure of the gap G can be maintained based on the measurement data (monitor information) of the temperature sensor 82 and the pressure sensor 83.

The controller 80 controls the vertical movement of the second elevating device 78 to precisely raise and lower the freezing device 30 such that the changes in the height (or the width) of the gap G due to the thermal contraction of the cold heat medium 35 can be avoided. The thermal contraction of the cold heat medium 35 is caused by the transfer of the cold heat from the chiller 31 to the cold heat medium 35 or by the flow of the coolant in the coolant supply channel 51. Since the controller 80 maintains the initial gap G, it is possible to continue the film forming process while controlling the substrate W to a desired temperature. In addition, as will be described in detail below, it is possible to maintain good adhesion between the cold heat transfer material 90 disposed in the gap G and the protrusion 24 and the recess 37.

Further, the controller 80 synchronously controls the first elevating device 77 and the second elevating device 78. Due to the synchronous control, the substrate support 20 (and the upper portion of the freezing device 30) is raised and lowered in the processing chamber 10 while maintaining the initial gap G, and the distance t1 between the target T and the substrate W is adjusted to a desirable level.

Next, the cold heat transfer materials 90 and 95 disposed in the gap G will be described in detail with reference to FIGS. 3 and 4.

As shown in FIG. 3, the gap G has the upper gap G1 between the flat bottom surface of the second plate 22 of the substrate support 20 and the flat upper surface of the cold heat medium 35, and the lower gap G2 between the recess 37 and the protrusion 24. The cold heat transfer material 90 is disposed in the lower gap G2. A sealing member (not shown) having a structure that does not hinder the rotation of the substrate support 20 during the rotation of the substrate support 20 with respect to the non-rotating cold heat medium 35 may be disposed at an outer peripheral edge of the upper gap G1.

The cold heat transfer material 90 is a powder. This powder mainly contains any one of powder copper, powder silver, or powder carbon-based material.

The cold heat transfer material 90 may be a powder in which an antistatic material is added to the above-described main element. By adding the antistatic material, it is possible to suppress deterioration of heat conduction caused by Electrostatic Levitation Furnace. The cold heat transfer material 90 may be a deformable powder having a cushioning property such as a core ball. Further, the cold heat transfer material 90 may a porous powder. In the case of the porous powder, the surface area of the powder can be increased and, thus, a trapping property (gas trapping property) of the coolant can be improved.

Since the cold heat transfer material 90 that is a large amount of powder is disposed in the lower gap G, the cold heat transfer material 90 can be accommodated in the gap G without spilling from the upper gap G1 to the side.

Further, since the cold heat transfer material 90 is a powder, it is possible to suppress shear resistance between the cold heat transfer material 90 and the protrusion 24 that rotates while being in contact with the cold heat transfer material 90 during the rotation of the substrate support 20 in the X3 direction in the film forming process. Accordingly, it is possible to suppress the increase in the temperature of the protrusion 24 and the increase in the temperature of the substrate support 20 due to the shear resistance. By suppressing the shear resistance, it is possible to suppress an increase in a load torque acting on the rotating device 40.

As shown in FIG. 3, the heat of the substrate support 20 is transferred to the upper gap G1 in a Y4 direction by the coolant supplied to the gap G (upper gap G1) in the Y1 direction through the coolant supply channel 51. Further, the heat of the substrate support 20 is transferred in a Y5 direction through the protrusion 24 and the cold heat transfer material 90 accommodated in the gap G2. The heat of the substrate support 20 is transferred through the protrusion 24, the cold heat transfer material 90, and the recess 37 of the cold heat medium 35 cooled by the flowing coolant.

Since the cold heat transfer material 90 is accommodated in the lower gap G2, the heat of the substrate support 20 is transferred through multiple heat transfer routes by the cold heat of the coolant provided to the upper gap G1 or the cold heat of the cold heat medium 35. Since the heat transfer routes in the Y5 direction and the Y6 direction through the cold heat transfer material 90 in physical contact with the protrusion 24 of the substrate support 20 are additionally provided in addition to the conventional heat transfer route in the Y4 direction, the heat exchange between the freezing device 30 and the substrate support 20 is considerably improved.

When the freezing device 30 is returned to the room temperature, the freezing device 30 has a relatively high temperature compared to that of the substrate support 20. Therefore, the heat transfer direction becomes opposite to the Y4 direction, the Y5 direction, and the Y6 direction. However, due to the multiple heat transfer routes, the heat exchange between the substrate support 20 and the freezing device 30 is considerably improved even when the freezing device 30 returns to the room temperature.

Accordingly, the thermal conductivity between the coolant in the gap G and the substrate support 20 is increased, and the heat exchange efficiency is improved. Since the cooling performance of the substrate support 20 is improved, the cooling efficiency of the substrate support 20 can be improved and the consumption of the coolant (cooling gas) required to cool the substrate support 20 can be minimized. Further, since the cooling efficiency of the substrate support 20 is improved, the cooling time of the substrate support 20 can be shortened and, also, the time required to return the cooled substrate support 20 to the room temperature can be shortened. As a result, it is possible to process the substrate W at a minimum running cost while ensuring a high throughput.

The cold heat transfer material 95 shown in FIG. 4 is grease (liquid lubricant). This grease is a low boiling point paste material mainly containing any one of nano-sized silver and nano-sized silicone.

Since the cold heat transfer material 95 is grease and the grease is accommodated in the lower gap G2, the cold heat transfer material 95 can be accommodated in the gap G without spilling from the upper gap G1 to the side. Further, since the cold heat transfer material 95 is grease, it is possible to suppress the shear resistance between the cold heat transfer material 95 and the protrusion 24 that rotates while being in contact with the cold heat transfer material 95 during the rotation of the substrate support 20 in the X3 direction in the film forming process. Accordingly, the increase in the temperature of the protrusion 24 and the increase in the temperature of the substrate support 20 due to the shear resistance can be suppressed. By suppressing the shear resistance, it is possible to suppress an increase in a load torque acting on the rotating device 40.

Since the cold heat transfer material 95 that is grease is accommodated in the second gap G2, the multiple heat transfer routes in the Y4, Y5, and Y6 directions and the heat transfer route in the opposite direction are obtained, similarly to the case of the cold heat transfer material 90 that is powder. Accordingly, the heat exchange between the substrate support 20 and the freezing device 30 becomes considerably efficient, and the substrate W can be processed at a minimum cost while ensuring a high throughput.

The following is description of a substrate processing method according to an embodiment. First, the substrate processing apparatus 100 shown in FIG. 1 is prepared (step of preparing the substrate processing apparatus). Next, the substrate W is placed on the substrate support 20 and rotated in the X3 direction. The coolant cooled by the freezing device 30 is supplied to the gap G, and the cold heat of the coolant (cooling gas) is transferred to the substrate support 20 through the cold heat transfer materials 90 and 95. In this state, a processing gas is supplied into the processing chamber 10 and film formation is performed on the substrate W using a PVD method (step of processing the substrate).

In accordance with to the substrate processing method according to the embodiment, the distance t1 between the entire substrate W and the corresponding target T can be maintained at a constant level by rotating the substrate support 20 on which the substrate W is placed. Therefore, a magnetoresistive element (magnetic film) having good in-plane uniformity and a high magnetoresistance ratio can be manufactured. Further, since the heat transfer route between the coolant and the substrate support 20 through the cold heat transfer materials 90 and 95 in the gap G is additionally provided in addition to the heat transfer route between the coolant in the gap G between the cold heat medium 35 and the substrate support 20 and the substrate support 20, the heat exchange efficiency between the coolant and the substrate support 20 is considerably improved. Accordingly, it is possible to process the substrate at a minimum running cost while ensuring a high throughput.

The present disclosure is not limited to the configuration described in the above embodiments, and may be applied to another embodiment in which other components are combined with the configuration described in the above embodiments. With respect to these points, the gist of the present disclosure can be changed without departing from the scope of the present disclosure, and can be appropriately determined depending on the application.

In the above-described embodiments, the case where the substrate processing apparatus 100 is a film forming apparatus has been described as an example. However, the substrate processing apparatus 100 may be, e.g., an etching apparatus or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A substrate processing apparatus comprising:
a processing chamber where a substrate support on which a substrate is placed and a target holder configured to hold a target are disposed;
a freezing device disposed with a gap with respect to a bottom surface of the substrate support and having a chiller and a cold heat medium laminated on the chiller;
a rotating device configured to rotate the substrate support;
a first elevating device configured to raise and lower the substrate support;
a coolant channel formed in the chiller to supply a coolant to the gap; and
a cold heat transfer material being in contact with the substrate support and the cold heat medium so as to transfer heat therebetween,
wherein an annular protrusion that is coaxial with a rotational center axis of the substrate support is formed on the bottom surface of the substrate support,
an annular recess that is coaxial with the protrusion is formed on an upper surface of the cold heat medium,
wherein the gap comprises an upper gap between the bottom surface of the substrate support and the upper surface of the cold heat medium and a lower gap between the recess and the protrusion, and
wherein the cold heat transfer material disposed in the lower gap.

2. The substrate processing apparatus of claim 1, wherein the cold heat transfer material is a powder.

3. The substrate processing apparatus of claim 2, wherein the powder contains any one of powder copper, powder silver, and a powder carbon-based material.

4. The substrate processing apparatus of claim 2, wherein the cold heat medium further contains an antistatic material.

5. The substrate processing apparatus of claim 3, wherein the cold heat medium further contains an antistatic material.

6. The substrate processing apparatus of claim 1, wherein the cold heat transfer material is grease.

7. The substrate processing apparatus of claim 6, wherein the grease contains any one of nano-sized silver or nano-sized silicone.

8. The substrate processing apparatus of claim 1, wherein the protrusion is loosely fitted in the recess.

9. The substrate processing apparatus of claim 1, further comprising:
a second elevating device configured to raise and lower the freezing device.

10. The substrate processing apparatus of claim 8, further comprising:
a second elevating device configured to raise and lower the freezing device.

11. The substrate processing apparatus of claim 9, further comprising:
a controller configured to control vertical movement of only the second elevating device and to synchronously control the first elevating device and the second elevating device.

12. The substrate processing apparatus of claim 10, further comprising:
a controller configured to control vertical movement of only the second elevating device and to synchronously control the first elevating device and the second elevating device.

13. The substrate processing apparatus of claim 11, further comprising:
a pressure sensor and a temperature sensor configured to measure a pressure and a temperature of the gap, respectively, wherein data measured by the pressure sensor and the temperature sensor are transmitted to the controller.

14. The substrate processing apparatus of claim 12, further comprising:
a pressure sensor and a temperature sensor configured to measure a pressure and a temperature of the gap, respectively, wherein data measured by the pressure sensor and the temperature sensor are transmitted to the controller.

15. A substrate processing method comprising:
preparing a substrate processing apparatus including a processing chamber where a substrate support on which a substrate is placed and a target holder configured to hold a target are disposed, a freezing device disposed with a gap with respect to a bottom surface of the substrate support and having a chiller and a cold heat medium laminated on the chiller, and a cold heat transfer material being in contact with the substrate support and the cold heat medium so as to transfer heat therebetween; and
rotating the substrate support on which the substrate is placed, supplying a coolant cooled by the freezing device to the gap, transferring cold heat of the coolant to the substrate support through the cold heat transfer material, and processing the substrate by supplying a processing gas into the processing chamber,
wherein an annular protrusion that is coaxial with a rotational center axis of the substrate support is formed on the bottom surface of the substrate support,
an annular recess that is coaxial with the protrusion is formed on an upper surface of the cold heat medium,
wherein the gap comprises an upper gap between the bottom surface of the substrate support and the upper surface of the cold heat medium and a lower gap between the recess and the protrusion, and
wherein the cold heat transfer material disposed in the lower gap.

16. The substrate processing method of claim 15, wherein the gap is adjusted by raising and lowering the freezing device in a state where the substrate support is fixed.

17. The substrate processing method of claim 15, wherein a distance between the substrate support and the target holder is adjusted while maintaining the gap by simultaneously raising and lowering the substrate support and the freezing device.

18. The substrate processing method of claim 16, wherein a distance between the substrate support and the target holder is adjusted while maintaining the gap by simultaneously raising and lowering the substrate support and the freezing device.

\* \* \* \* \*